United States Patent [19]
Lam

[11] Patent Number: 5,367,763
[45] Date of Patent: Nov. 29, 1994

[54] TAB TESTING OF AREA ARRAY INTERCONNECTED CHIPS

[75] Inventor: Ken Lam, Colorado Springs, Colo.

[73] Assignee: Atmel Corporation, San Jose, Calif.

[21] Appl. No.: 129,753

[22] Filed: Sep. 30, 1993

[51] Int. Cl.$^5$ .............................................. H01R 43/00
[52] U.S. Cl. ...................................... 29/827; 29/846; 437/220
[58] Field of Search ................ 29/827, 830, 832, 846; 174/52.4; 437/8, 220

[56] References Cited

U.S. PATENT DOCUMENTS

| | | | |
|---|---|---|---|
| 3,401,126 | 9/1968 | Miller et al. | 252/514 |
| 3,429,040 | 2/1969 | Miller . | |
| 4,472,876 | 9/1984 | Nelson | 29/840 |
| 4,763,409 | 8/1988 | Takekawa et al. | 29/827 |
| 4,866,508 | 9/1989 | Eichelberger et al. | 29/832 X |
| 5,008,614 | 4/1991 | Shreeve et al. | 174/52.4 X |
| 5,036,380 | 7/1991 | Chase | 437/220 X |
| 5,042,147 | 8/1991 | Tashiro | 29/846 X |
| 5,148,265 | 9/1992 | Khandros et al. . | |
| 5,148,266 | 9/1992 | Khandros et al. . | |
| 5,156,983 | 10/1992 | Schlesinger et al. | 29/830 X |

FOREIGN PATENT DOCUMENTS

| | | | |
|---|---|---|---|
| 2178231 | 2/1987 | United Kingdom | 437/206 |

*Primary Examiner*—Carl J. Arbes
*Attorney, Agent, or Firm*—Schneck & McHugh

[57] ABSTRACT

A method and apparatus for testing and connecting integrated circuit chips to external packaging and circuitry. A plurality of electrically conductive leads are formed on an electrically insulative substrate by tape automated bonding methods. The leads extend from peripherally disposed test terminals to centrally disposed interconnect pads and are aligned therebetween with bond pads that are disposed near a perimeter of a face of a chip. The leads are connected to the bond pads and are encapsulated with a cement, and the substrate is adhered to the chip face. Electronic characteristics of the chip are tested by channeling electrical signals via the test terminals. The leads are then severed closely peripheral to the bond pads, disconnecting the test terminals from the chip. The chips that pass the testing are connected via the interconnect pads, which may be arranged in a pad grid array, to matching terminals in a package. After severing, an electrically insulative resist may be deposited on the leads but not on the interconnect pads, and electrically conductive bumps deposited on the interconnect pads for connection with the package terminals.

18 Claims, 2 Drawing Sheets

TAB TESTING OF AREA ARRAY INTERCONNECTED CHIPS

TECHNICAL FIELD

The present invention relates generally to packaging integrated circuit chips. More particularly, it relates to a method and apparatus for connecting and testing integrated circuit chips with external circuitry.

BACKGROUND ART

The need for lightweight, thin, low cost packaging materials for integrated circuit (IC) applications such as consumer products has led to development and use of a method of connecting IC chips termed tape automated bonding (TAB). TAB involves forming electrical leads for IC chips on thin, flexible tape which is similar in appearance to 35 mm film. The tape is electrically insulative, and the leads are typically formed from a thin layer of metal which has been deposited on the tape and photolithographically etched. The precisely formed leads are aligned with and bonded to signal terminals from the integrated circuit located near a perimeter of a surface of the chip. The signal terminals of the chip are often termed "bond pads." The leads extend outwardly from the chip for connection with an external element, often called a "package" or "assembly."

A problem with TAB is that the leads may be only a few thousandths of an inch in cross-section and are cantilevered from the tape at the point where the leads are to be bonded to the terminals of the chip. These tiny, cantilevered electrical leads are thus the only mechanical support between the chip and the package at the edge of the chip, an area prone to deformational stress from any change in position of the chip relative to the package. As a result, the leads may break at this point, causing the chip and package to fail.

Another problem with TAB is that the leads fan outwardly from the chip for bonding to the package, and thus require a larger package area than that dictated by the size of the chip. It is often desirable, and appears to be a long term trend in electronics, to condense information capabilities in smaller packages, and the larger area or "footprint" required by traditional TAB packaging stands in the way of this trend.

Another type of electrical and mechanical connection of an IC chip to a package is called "flip-chip" or "controlled collapse chip connection" (C4), and is described in U.S. Pat. Nos. 3,401,126 Lewis F. Miller et al, and 3,429,040 to Lewis F. Miller. C4 involves forming solder balls on the surface of the chip that connect signal terminals of the chip with corresponding connections on the package, the solder balls providing both electrical contacts and mechanical support between the chip and the package.

One difficulty with the flip chip type interconnection is that the thermal coefficient of expansion is usually significantly different for the chip, often formed of silicon, and the package, typically made of ceramic and materials conventionally used in forming printed circuit boards. As a result, changes in temperature of the chip or substrate, or both, lead to stresses between the solder balls and the chip or substrate. This may cause the solder ball connections to break, or may cause stresses within the chip that create chip failures.

Another difficulty with the flip-chip interconnections is that they do not allow testing prior to committing the chip to the package, other than wafer probe testing which does not allow testing with all the signal terminals connected or "burn-in" testing such as can be performed with TAB. This difficulty is underscored by the realization that it is often more appropriate to speak of committing the package to the chip rather than the chip to the package, since discarding even a multi-chip package may be more economical than trying to determine which chip of the module failed and to then replace that chip.

Yet another difficulty with this technology is that many IC chips are designed and built with bond pads formed in a row near the perimeter of the chip surface. Since a chip may have well over 500 such bond pads, the organizing of these terminals into a row requires that the terminals and the separation between the terminals be too small to reliably form effective solder bumps for connection to a package.

One approach to overcoming these difficulties is described in U.S. Pat. No. 4,472,876 to Nelson, which teaches a flexible area bonding tape containing electrical paths connecting a chip to a package. The tape and conductive paths absorb stresses caused by thermal expansion and also conduct heat from the chip to the package, thereby reducing expansion stress. The approach of Nelson, however, requires an interconnection package having a larger footprint than that of the chip. Another approach is described in U.S. Pat. Nos. 5,148,265 and 5,148,266, both issued to Khandros et al., which also describe an insulative tape having conductive leads connecting terminals on a chip with those on a substrate. The interconnection with the substrate does not fan out, instead being located in an array having an area equal to or less than that of the chip surface, but the chip is tested with wafer probes. This wafer probe testing does not allow testing of all the functions of a chip, is more expensive than TAB testing, and has additional disadvantages caused by a reduction of thermal conductivity created to accommodate the wafer probe testing.

It is an object of the present invention to provide improved testing of a chip prior to interconnection to a package, while that interconnection occupies a surface no larger than that of the chip.

SUMMARY OF THE INVENTION

The present invention provides a means for connecting an integrated circuit chip with external elements that offers many of the advantages of both tape automated bonding and area array interconnections.

An array of electrically conductive leads is formed on an electrically insulative substrate, the leads extending inwardly to a chip from test terminals peripheral to the chip so as to align with bond pads disposed in a row near a perimeter of a face of the chip, like a traditional TAB lead frame. The leads continue inwardly from the bond pads, however, to conclude in an array of interconnect pads disposed on an area of the substrate above the face of the chip.

The leads are bonded to the bond pads with which they are aligned, and then tested with the test terminals of the TAB lead frame. This testing prior to interconnection with external elements allows a greatly increased yield of functional chips to be connected to a package, which in turn saves costs and increases the quality of the product. Those chips which pass the test then have the portion of the leads connecting the bond pads to the test terminals excised close to the bond pads. The interconnect pads are then connected to a matching array of package terminals which, like the interconnect pads, are arranged in an array having an area less than that defined by the row of bond pads near the perimeter of the face of the chip.

The present invention is particularly advantageous for the packaging of multi-chip modules, since the probability that a package contains a defective chip increases with the number of chips contained in the package. The testing of chips prior to chip packaging afforded by the present invention thus reduces the risk that a multi-chip package will be discarded because one or more of the chips in the module is defective. Moreover, the small interconnect footprint allows many chips to be packed closely together.

BEST MODE FOR CARRYING OUT THE INVENTION

Figure 1:
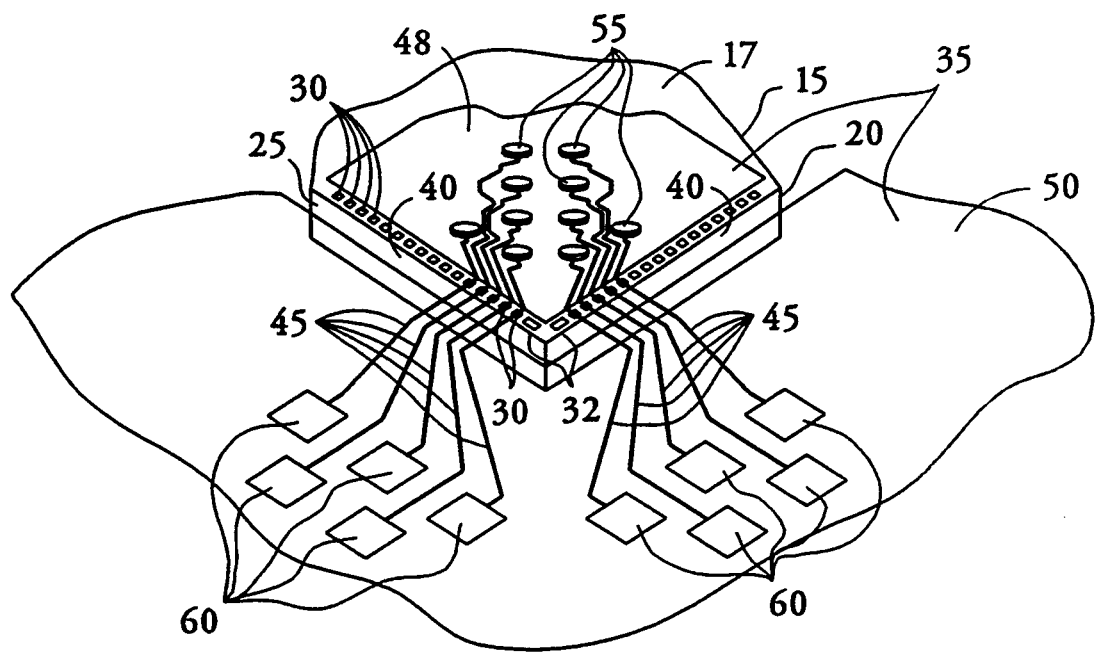
FIG. 1 is a perspective view of a portion of the present invention connected to a portion of an integrated circuit chip.

Referring to FIG. 1, a portion of a semiconductor integrated circuit chip 15 having a top surface or face 17 and edges 20 and 25 is shown. The chip 15 has a row of bond pads 30 located near a perimeter 32 of its face 17 that is defined, in part, by edges 20 and 25. The bond pads 30 offer electrical communication with the internal circuitry of the chip 15.

Disposed on top of the face 17 is a thin, flexible, electrically insulative, thermally conductive substrate or tape 35. The tape 35 has a gap 40 above the perimeter of the face 17 where the tape 35 has been removed. On top of the tape 35 are a plurality of thin, electrically conductive leads 45 that extend over the gap 40 to connect an inner area 48 of the tape 35 with an outer area 50 of the tape 35. Each conductive lead 45 concludes at one end with an interconnect pad 55 located on the inner area 48 and at another end with a test terminal 60 located on the outer area 50 of the tape 35. The interconnect pads 55 are arranged on the inner area 48 in a pad grid array.

Each conductive lead 45 is aligned with and connected to a bond pad 30. The leads 45 are bent in several places between their connections with the bond pads 30 and the interconnect pads 55, allowing the distance between the bond pads 30 and the interconnect pads 55 to vary in length in order to alleviate stress caused by differential thermal expansion.

Figure 2:
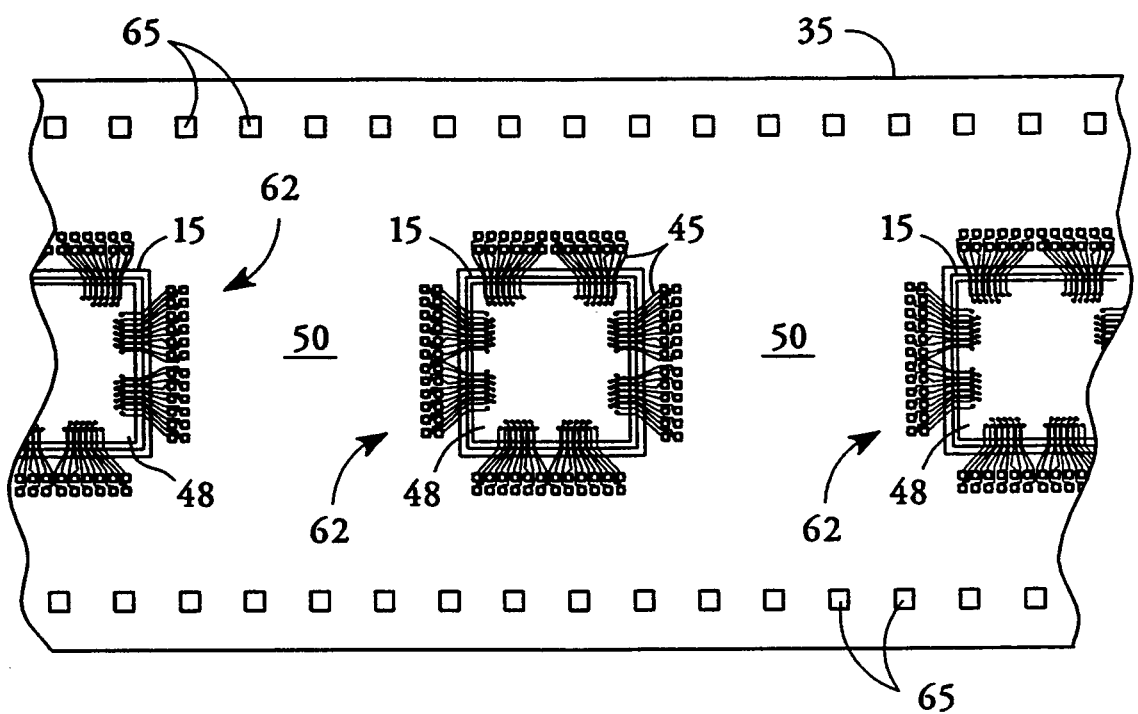
FIG. 2 is a top view of a portion of a tape with several devices of the present invention connected to several integrated circuit chips.

FIG. 2 shows several devices 62 comprised of a portion of the tape 35 having leads 45, interconnect pads 55 and test terminals 60, each corresponding to a different chip 15 are shown. For clarity of illustration, the devices 62 are shown in FIGS. 1 and 2 with only a few leads 45, interconnect pads 55 and test terminals 60. In practice, such devices 62 may each have several hundred such leads 45, each lead 45 connecting an interconnect pad 55 with a test terminal 60. The test terminals 60 are typically formed in area arrays peripheral to the L5 chip 15 in order to facilitate connection of the device 62 to external circuitry, not shown, for testing the chip 15.

Each test terminal 60 may have generally square sides approximately 0.75 mm in length, and may be separated from adjacent test terminals 60 by a similar distance. The interconnect pads 55 are arranged in an area array over the face 17 of the chip 15, each interconnect pad 55 being generally circular with a typical diameter of about 0.3 mm and spaced from adjacent such pads by about 0.3 mm. The bond pads 30 of the chip 15 may be generally rectangular, with a width in a direction parallel to the adjacent perimeter 32 of about 0.5 mm. The leads 45 may be approximately 0.025 mm in width, and separated from each other by at least that distance. The dimensions given above are for a chip with 368 bond pads and can be varied to suit chips having more or less bond pads.

The tape 35 may be composed of polyimide or any other flexible, electrically insulative substrate known in the art of TAB, and may be approximately 0.1 mm in thickness. The tape 35 has sprocket holes 65 for advancement and alignment, and is similar in appearance to film for 35 mm cameras.

The device 62 is formed by adhering a thin sheet of copper, not shown, which may be about 0.3 mm in thickness to the tape 35 with epoxy and etching the sheet to form the leads 45, interconnect pads 55 and test terminals 60. Alternate methods of lead frame formation known for TAB may instead be employed. The gap 40 is then formed, preferably by etching, from the tape 35 in a strip corresponding to the perimeter 32. The tape 35 is then positioned over the chip 15 so that contact areas of the leads 45 are precisely aligned with bond pads 30. The inner area 48 is adhered to the face 17 of the chip 15, preferably with a thermally conductive substance such as silicon adhesive, and the leads 45 are connected to the bond pads 30. The leads 45 may be connected with the L5 bond pads 30 by thermocompressive bonding or any other technique known in the art. Preferably gold or eutectic alloy solder bumps, not shown, have been deposited on the bond pads 30 as an aid to such bonding. Such bumps help to avoid breakage of the leads 45 during bonding. A ribbon of epoxy, not shown, is then flowed around and between the connections between the leads 45 and the bond pads 30 to encapsulate and rigidify those connections.

Figure 3:
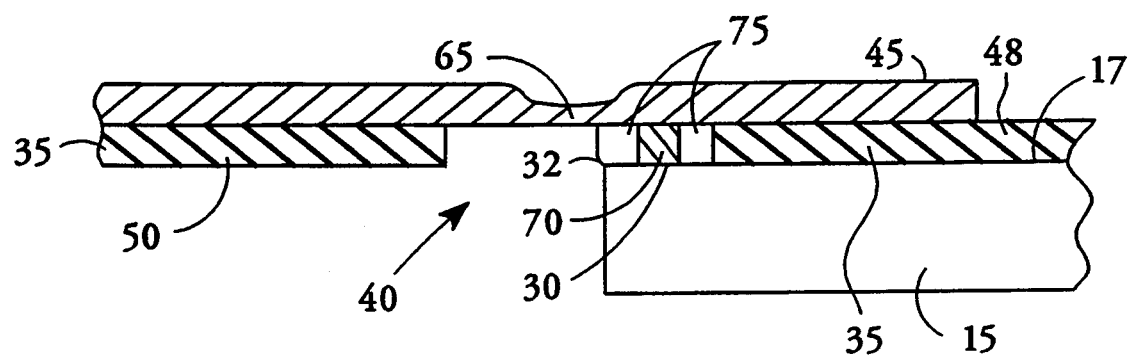
FIG. 3 is a cross-sectional view of a lead of the present invention connected to an integrated circuit chip for testing.

As is most easily seen in the cross-sectional view of a lead 45 shown in FIG. 3, the leads 45 have been etched near the perimeter 32 of the chip 15 more than elsewhere, so that a weakened or thinned section 65 exists on each lead 45 approximately above the perimeter 32 of the face 17. Although FIG. 3 shows a cross-section of a lead 45 that is vertically thinner or notched, the thinned section 65 can also or alternatively be of a reduced thickness in a horizontal dimension. Also near the perimeter 32, but positioned slightly closer to an interior of the face 17, is the gap 40 in the tape 35 between the inner tape area 48 and the outer tape area 50. A bump 70 formed from gold or other metals such as eutectic alloys used for TAB bonding bumps has been deposited on a bond pad 30, and the bump 70 has been bonded to the lead 45. Such bumps 70 preferably have a top that is slightly higher than the thickness of the tape 35, so that they can be connected to the leads 45 without the leads being vertically deformed. An epoxy encapsulant 75 has been flowed onto, under and, although not shown in this cross-sectional view, between the connections between the leads 45 and the gold bumps 70 in an area of the gap 40 within the perimeter 32.

After the encapsulant 75 has hardened, the chip 15 is tested by applying electrical signals to the test 10 terminals 60. Each test terminal 60 is, as described above, electrically connected to a bond pad 30, allowing the chip 15 to have full-scale testing performed of all of its circuits. It is possible to perform tests in this manner that would not be possible using wafer probes. For example, burn in and temperature testing of the chip 15 may be performed. Only chips 15 that pass this testing are connected to a package such as a circuit board, thereby greatly increasing the likelihood that the chip or chips in a package are fully functional. It should also be noted that the epoxy encapsulant 75 and the attachment of the leads 45 to the inner area 48 of the tape 35 offer stronger connections than typical cantilevered lead end to bond pad connections known in TAB.

Figure 4:
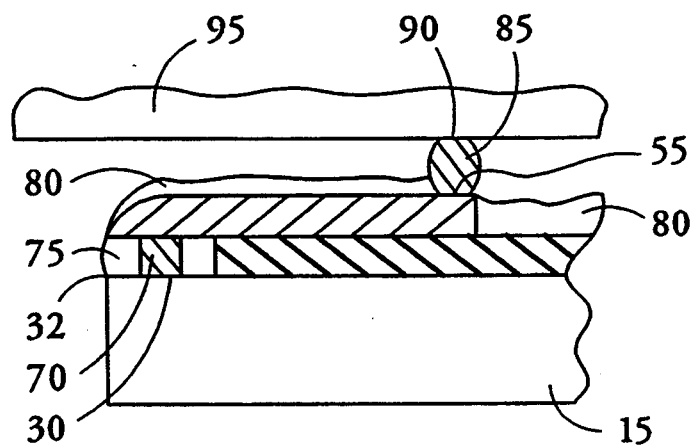
FIG. 4 is a cross-sectional view of the lead and chip of FIG. 3 connected to a package after the test lead has been severed.

After testing of the chip 15 via the test terminals 60 has been completed, the leads 45 may be severed above the perimeter 32, as shown in FIG. 4. This severing may be accomplished by applying a stress to the leads 45 that is sufficient to cause the leads 45 to break at their thinned sections 65 near the encapsulant 75. Alternatively, the leads 45 may be severed with a knife or other known methods, not shown, in which case the leads 45 may not need the thinned sections 65 described above. A solder resist 80 is deposited on the leads 45 and the inner area 48 of the tape 35 but not on the array of interconnect pads 55, in order to isolate the leads from "lands" offered by the interconnect pads 55 for solder to be deposited onto. Solder bumps 85 are then formed on the interconnect pads 55 for connection with a predetermined array of terminals 90 of a package 95, and the chip is connected to the package by known flip-chip techniques.

Alternatively, connection of the interconnect pads 55 to the package 95 may be by means of a z-axis adhesive, not shown. A z-axis adhesive, which may be an epoxy paste, is formed to be electrically conductive in only one direction. When such an adhesive is used in the present invention to connect a device 62 to a package 95, it is formed to conduct electricity in the general direction connecting the device 62 and the package 95, without conducting electricity generally transversely to that direction. Thus, the z-axis adhesive forms electrically conductive pathways connecting the array of interconnect pads 55 with their respective terminals 90, without allowing crossover connections or short circuits.

Thus the interconnection of the chip 15 with a package 95 requires only the area of the array of interconnect pads 55, which is less than the area of the chip face 17, yet the chip 15 can be fully tested prior to interconnection.

I claim:

1. A method of making a device for connecting an integrated circuit chip to external circuitry comprising:
    providing an integrated circuit chip having bond pads disposed near a perimeter of a chip face;
    positioning a flexible tape having an electrically insulative substrate and a plurality of electrically conductive leads having inner portions and outer portions, said inner portions extending from said bond pads to interconnect pads disposed within a central region of said chip face, said outer portions extending from between said bond pads to peripherally disposed test terminals such that said tape is adjacent to said chip face and said leads are aligned with said bond pads;
    bonding said bond pads to said leads at areas of said leads between said interconnect pads and said test terminals, thereby positioning said interconnect pads within said perimeter;
    testing said integrated circuit chip, including channeling electrical signals via said test terminals; and
    severing said leads proximate to said perimeter of said chip, thereby disconnecting both said outer portions and said test terminals from said chip.

2. The method of claim 1 further comprising bonding said interconnect pads to external circuitry, after severing said outer portions of said leads proximate to said perimeter of said chip.

3. The method of claim 1 further comprising bonding said substrate to said chip face before severing said outer portions of said leads proximate to said perimeter of said chip.

4. The method of claim 3 wherein severing said outer portions of said leads proximate to said perimeter of said chip includes:
    providing said leads with a weakened portion proximate to said perimeter; and
    applying a stress to said leads sufficient to cause said leads to break at said weakened portion, but insufficient to cause said leads to break elsewhere.

5. The method of claim 1 further comprising forming said leads, including:
    depositing an electrically conductive layer on said substrate; and
    selectively etching said conductive layer.

6. The method of claim 1 further comprising removing a strip of said substrate corresponding to said bond pads, prior to bonding said bond pads to said leads at areas of said leads between said interconnect pads and said test terminals.

7. The method of claim 1 further comprising forming said interconnect pads in an area array on a surface of said tape distal to said chip face.

8. The method of claim 7 further comprising:
    forming said leads on said surface; and
    depositing an electrically insulative coating on said leads but not on said interconnect pads.

9. The method of claim 8 further comprising depositing solder bumps on said interconnect pads.

10. The method of claim 3 wherein severing said leads proximate to said bond pads includes encapsulating said leads with a rigid substrate around said bond between said leads and said bond pads.

11. A method of connecting an integrated circuit chip having perimetrically disposed bond pads to external circuitry comprising:
    forming a tape automated bonding frame having a plurality of electrically conductive leads, said leads having test terminals at outer ends and interconnect pads at inner ends;
    aligning said leads with said bond pads such that said test terminals are disposed outside said chip perimeter and said interconnect pads are disposed within an area defined by said chip perimeter;
    connecting said bond pads to contact areas of said leads disposed between said test terminals and said interconnect pads, thereby defining an inner portion and an outer portion of each said lead, said inner portion extending between said interconnect pads and said bond pads, said outer portion extending between said bond pads and said test terminals;

testing electronic characteristics of said chip, including applying electrical signals at said test terminals;

severing said outer portions of said leads between said contact areas and said test terminals proximate to said perimeter, thereby disconnecting both said outer portion and said outer lead ends; and connecting said interconnect pads to matching external element terminals.

12. The method of claim 11 including arranging said interconnect pads in pad grid array.

13. The method of claim 11 wherein forming said frame includes attaching said leads to a first surface of a support substrate and includes adhering a second surface of said support substrate to said face of said chip.

14. The method of claim 11 wherein forming said frame includes fabricating said electrically conductive leads to be reduced in thickness near said bond pads between said contact areas and said test terminals.

15. The method of claim 14 wherein severing said leads between said contact areas and said test terminals proximate to said bond pads includes stressing said leads a sufficient amount to break said leads at that location but not at other locations.

16. The method of claim 11 further comprising depositing an electrically insulative resist on said leads within said area defined by said chip perimeter.

17. The method of claim 16 further comprising depositing solder bumps on said interconnect pads for connecting said interconnect pads to said matching external element terminals.

18. The method of claim 17 wherein connecting said interconnect pads to said matching external element terminals includes applying a z-axis adhesive.

* * * * *